(12) United States Patent
Gan et al.

(10) Patent No.: US 8,779,601 B2
(45) Date of Patent: Jul. 15, 2014

(54) EMBEDDED WAFER LEVEL PACKAGE FOR 3D AND PACKAGE-ON-PACKAGE APPLICATIONS, AND METHOD OF MANUFACTURE

(75) Inventors: Kah Wee Gan, Singapore (SG); Yaohuang Huang, Singapore (SG); Yonggang Jin, Singapore (SG)

(73) Assignee: STMicroelectronics Pte Ltd, Singapore (SG)

(*) Notice: Subject to any disclaimer, the term of this patent is extended or adjusted under 35 U.S.C. 154(b) by 0 days.

(21) Appl. No.: 13/287,826

(22) Filed: Nov. 2, 2011

(65) Prior Publication Data
US 2013/0105973 A1   May 2, 2013

(51) Int. Cl.
*H01L 23/48* (2006.01)
*H01L 23/52* (2006.01)
*H01L 29/40* (2006.01)

(52) U.S. Cl.
USPC ............................ 257/778; 257/686; 257/777

(58) Field of Classification Search
USPC .................................. 257/686, 777, 778, 698
See application file for complete search history.

(56) References Cited

U.S. PATENT DOCUMENTS

| | | |
|---|---|---|
| 4,074,342 A | 2/1978 | Honn et al. |
| 4,603,374 A | 7/1986 | Wasielewski |
| 4,715,115 A | 12/1987 | King et al. |
| 5,222,014 A | 6/1993 | Lin |
| 5,309,011 A | 5/1994 | Tazunoki et al. |
| 5,355,580 A | 10/1994 | Tsukada |
| 5,488,200 A | 1/1996 | Tsukada |
| 5,936,843 A | 8/1999 | Ohshima et al. |
| 6,253,992 B1 | 7/2001 | Fjelstad |
| 6,271,469 B1 | 8/2001 | Ma et al. |
| 6,344,682 B1 | 2/2002 | Tomita |
| 6,350,668 B1 | 2/2002 | Chakravorty |
| 6,680,529 B2 | 1/2004 | Chen et al. |
| 6,717,245 B1 | 4/2004 | Kinsman et al. |
| 6,815,254 B2 * | 11/2004 | Mistry et al. ................. 438/108 |
| 6,828,665 B2 | 12/2004 | Pu et al. |

(Continued)

OTHER PUBLICATIONS

Johnson, "STATS ChipPAC Expands eWLB to Reconstituted 300 mm Wafers," *Semiconductor International*, published Apr. 15, 2010, downloaded from http://english.ime.cas.cn/ns/es/201004/t20100429_53569.html, which was published by Microelectronice of Chinese Academy of Sciences, 2007, 2 pages.

(Continued)

*Primary Examiner* — S. V. Clark
(74) *Attorney, Agent, or Firm* — Seed IP Law Group PLLC

(57) ABSTRACT

An eWLB package for 3D and PoP applications includes a redistribution layer on a support wafer. A semiconductor die is coupled to the redistribution layer, and solder balls are also positioned on the redistribution layer. The die and solder balls are encapsulated in a molding compound layer, which is planarized to expose top portions of the solder balls. A second redistribution layer is formed on the planarized surface of the molding compound layer. A ball grid array can be positioned on the second redistribution layer to couple the semiconductor package to a circuit board, or additional semiconductor dies can be added, each in a respective molding compound layer. The support wafer can act as an interposer, in which case it is processed to form TSVs in electrical contact with the first redistribution layer, and a redistribution layer is formed on the opposite side of the support substrate, as well.

10 Claims, 3 Drawing Sheets

(56) References Cited

U.S. PATENT DOCUMENTS

| | | | |
|---|---|---|---|
| 6,882,054 B2 | 4/2005 | Jobetto | |
| 6,940,169 B2 | 9/2005 | Jin et al. | |
| 7,045,899 B2 | 5/2006 | Yamane et al. | |
| 7,064,440 B2 | 6/2006 | Jobetto et al. | |
| 7,067,911 B1 | 6/2006 | Lin et al. | |
| 7,141,873 B2 | 11/2006 | Aoyagi | |
| 7,192,805 B2 | 3/2007 | Jobetto | |
| 7,193,301 B2 | 3/2007 | Yamaguchi | |
| 7,345,361 B2 | 3/2008 | Mallik et al. | |
| 7,489,032 B2 | 2/2009 | Jobetto | |
| 7,535,509 B2 | 5/2009 | Takayama | |
| 7,671,459 B2 | 3/2010 | Corisis et al. | |
| 7,714,453 B2 | 5/2010 | Khan et al. | |
| 7,772,687 B2 | 8/2010 | Inoue | |
| 7,871,861 B2 | 1/2011 | Song et al. | |
| 7,932,613 B2 | 4/2011 | Child | |
| 7,989,707 B2 | 8/2011 | Yamano et al. | |
| 8,003,496 B2 | 8/2011 | Oh et al. | |
| 8,004,092 B2 | 8/2011 | Lin et al. | |
| 8,035,213 B2 * | 10/2011 | Lee et al. | 257/692 |
| 8,105,915 B2 * | 1/2012 | Camacho et al. | 438/455 |
| 8,106,495 B2 | 1/2012 | Kajiki | |
| 8,119,454 B2 | 2/2012 | Jin | |
| 8,125,066 B1 | 2/2012 | Kang | |
| 8,158,888 B2 | 4/2012 | Shen et al. | |
| 8,222,964 B2 | 7/2012 | Avni et al. | |
| 8,241,964 B2 | 8/2012 | Pagaila et al. | |
| 8,482,134 B1 * | 7/2013 | Darveaux et al. | 257/780 |
| 2001/0026010 A1 | 10/2001 | Horiuchi et al. | |
| 2002/0070443 A1 | 6/2002 | Mu et al. | |
| 2004/0033643 A1 | 2/2004 | Odegard et al. | |
| 2005/0242422 A1 * | 11/2005 | Klein et al. | 257/686 |
| 2006/0091521 A1 | 5/2006 | Cady et al. | |
| 2006/0256222 A1 | 11/2006 | Tsai | |
| 2007/0090508 A1 | 4/2007 | Lin et al. | |
| 2008/0017968 A1 | 1/2008 | Choi et al. | |
| 2008/0083988 A1 | 4/2008 | Lin | |
| 2009/0057895 A1 | 3/2009 | Lin et al. | |
| 2009/0127688 A1 | 5/2009 | Lee et al. | |
| 2009/0212412 A1 | 8/2009 | Yoon | |
| 2009/0261466 A1 | 10/2009 | Pagaila et al. | |
| 2010/0072600 A1 | 3/2010 | Gerber | |
| 2010/0090323 A1 | 4/2010 | Shinoda et al. | |
| 2010/0117212 A1 | 5/2010 | Corisis et al. | |
| 2010/0148316 A1 | 6/2010 | Kim et al. | |
| 2010/0244263 A1 | 9/2010 | Lin et al. | |
| 2011/0024905 A1 | 2/2011 | Lin et al. | |
| 2011/0032400 A1 | 2/2011 | Yang | |
| 2011/0156230 A1 | 6/2011 | Goh | |
| 2011/0156240 A1 | 6/2011 | Luan et al. | |
| 2011/0156250 A1 | 6/2011 | Goh et al. | |
| 2011/0157452 A1 | 6/2011 | Goh et al. | |
| 2011/0157853 A1 | 6/2011 | Goh | |
| 2011/0241192 A1 | 10/2011 | Ding et al. | |
| 2011/0260303 A1 | 10/2011 | Pagaila et al. | |
| 2011/0291274 A1 | 12/2011 | Meyer et al. | |
| 2011/0316146 A1 | 12/2011 | Pagaila et al. | |
| 2011/0316156 A1 | 12/2011 | Pagaila et al. | |
| 2012/0049364 A1 | 3/2012 | Sutardja et al. | |
| 2012/0161332 A1 | 6/2012 | Chua et al. | |
| 2012/0299191 A1 | 11/2012 | Camacho | |
| 2013/0037929 A1 | 2/2013 | Essig et al. | |
| 2013/0062764 A1 | 3/2013 | Jin | |
| 2013/0105973 A1 | 5/2013 | Gan et al. | |
| 2013/0200528 A1 | 8/2013 | Lin et al. | |

OTHER PUBLICATIONS

ASE Tech Forum, "ASE PoP (TRD PoP & MAP PoP)," The Advanced Semiconductor Engineering Ground, Sep. 2007, 37 pages.

Goh, "Fan-Out Wafer Level Package With Polymeric Layer for High Reliability," U.S. Appl. No. 12/649,130, filed Dec. 29, 2009, 31 pages.

Jin, "Apparatus and Method for Placing Solder Balls," U.S. Appl. No. 13/640,275, filed Dec. 29, 2011, 31 pages.

* cited by examiner

EMBEDDED WAFER LEVEL PACKAGE FOR 3D AND PACKAGE-ON-PACKAGE APPLICATIONS, AND METHOD OF MANUFACTURE

BACKGROUND

1. Technical Field

Embodiments of the disclosed invention are directed to an embedded wafer level package for a semiconductor device, and in particular, to such a device that includes through-connections extending through a package wafer of the device.

2. Description of the Related Art

For manufacturers of semiconductor devices, there is a continuing pressure to increase the density and reduce the size of the devices, so that more devices can be made on a single wafer of semiconductor material, and so that products that incorporate the devices can be made more compact. One response to this pressure has been the development of chip scale packaging and wafer level packaging. These are packages that have a footprint that is very close to the actual area of the semiconductor die. They are generally direct surface mountable, using, e.g., ball grid arrays and flip chip configurations.

Another development is the reconfigured wafer, or reconstituted wafer, in which a semiconductor wafer is separated into individual dice, which are spaced some greater distance apart than on the original wafer and embedded in a layer of molding compound to form the reconfigured wafer. A redistribution layer is formed over the dice to relocate contact points on the new wafer. One benefit is that this provides increased area for each die for "back end" processes, such as the formation of contacts at a scale or pitch that is compatible with circuit board limitations, without sacrificing valuable real estate on the original wafer. Such packages are typically referred to as fan-out wafer level packages, because the contact positions of the original die are "fanned out" to a larger foot print.

A 3D package is a package in which a plurality of semiconductor dice are stacked vertically within a single package.

A package-on-package (PoP) configuration is a package that has one face configured to be coupled to a circuit board or chip carrier, and an opposite face configured to receive another semiconductor package.

An interposer is an interface structure positioned between a semiconductor device and another element to which the device is coupled. The interposer provides routing of electrical contacts from one side to the other for proper connection.

BRIEF SUMMARY

According to an embodiment, an embedded wafer level package is provided that includes a redistribution layer on a support wafer. A semiconductor die is positioned on the redistribution layer and coupled thereto. Solder balls are also positioned on the redistribution layer in contact with electrical traces thereof. the die and solder balls are encapsulated in a molding compound layer, which is planarized to expose top portions of the solder balls. A second redistribution layer is positioned on the planarized surface of the molding compound layer, in electrical contact with the expose top portions of the solder balls.

According to an embodiment, a ball grid array is positioned on the second redistribution layer for coupling of the semiconductor package to a circuit board. Alternatively, a 3-D package is provided, in which another semiconductor die is stacked on the molding compound layer and embedded in a second molding compound layer, together with additional solder balls, similar to the layer of the first semiconductor die.

According to a further embodiment, the support wafer can act as an interposer layer for a package-on-package configuration, in which case the support wafer includes TSVs in electrical contact with the first redistribution layer on one side of the support wafer and an additional redistribution layer on the opposite side of the support substrate. A second package is positioned over the support substrate with a ball grid array coupled to the additional redistribution layer.

DETAILED DESCRIPTION

FIGS. 1-5 are diagrammatical side views of a portion of a wafer, showing a package 100 at various stages of manufacture. Typically, a large plurality of packages are manufactured on a wafer, which is cut into individual packages when the manufacturing process is complete or nearly so. However, for ease of illustration and comprehension, only one of the packages 100 is shown in detail, the other packages being substantially identical.

Figure 1:
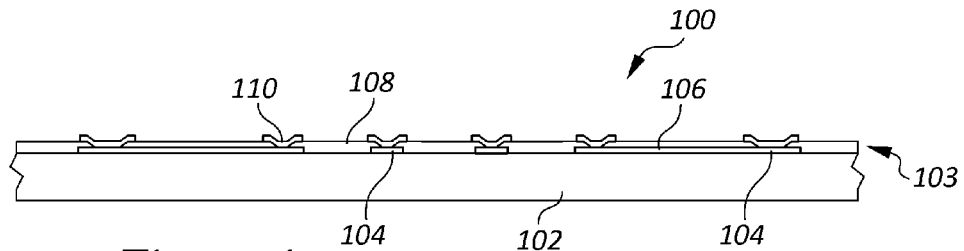
FIGS. 1-4 are diagrammatical side views of a portion of a wafer, showing respective stages of manufacture of a single semiconductor package on the wafer, according to an embodiment.

FIG. 1 shows a support substrate 102, which is preferably semiconductor material, such as, e.g., silicon, and on which a first redistribution layer (RDL) 103 is formed. The first RDL 103 includes an electrically conductive layer that is deposited and patterned to form contact pads 104 and electrical traces 106. A dielectric layer 108 is deposited over the conductive layer 105 and patterned to form openings over the contact pads 104. An under-ball metallic (UBM) layer is deposited and patterned to define contact/landing pads 110 configured to receive solder ball contacts. The first RDL 103 can include additional layers, according to the specific design of the device and the materials used. For example, if the substrate 102 is electrically conductive, an insulating layer will be formed over the substrate, after which the layer for contact pads 104 and traces 106 is formed as part of the RDL 103. Likewise, additional conductive layers, passivation layers, insulative layers, etc. can be provided, as necessary.

Figure 2:
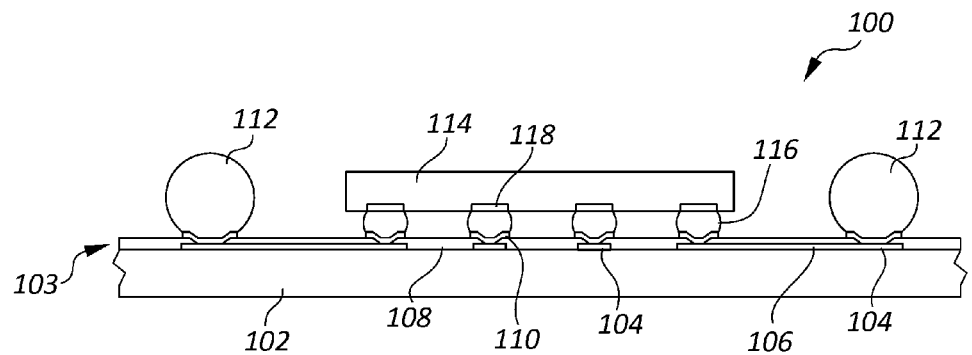

FIG. 2 shows solder balls 112, which are placed on the wafer 102 at selected ones of the contact pads 104. A semiconductor die 114, having circuit pads 117 on which micro-bumps 116 are positioned in a flip-chip configuration, is positioned with each of the micro-bumps 116 in contact with a respective one of the contact pads 104. The substrate 102 is then heated to reflow the solder balls 112 and micro-bumps 116. Typically, a large number of dice are coupled to a single substrate 102 in this manner, each of which will become part of a respective semiconductor package when the substrate is cut into individual packages. For the sake of simplicity, only one die 114 is shown in the drawings. However, in practice, the number of dice that are coupled to the substrate 102 can number in the hundreds.

Figure 3:
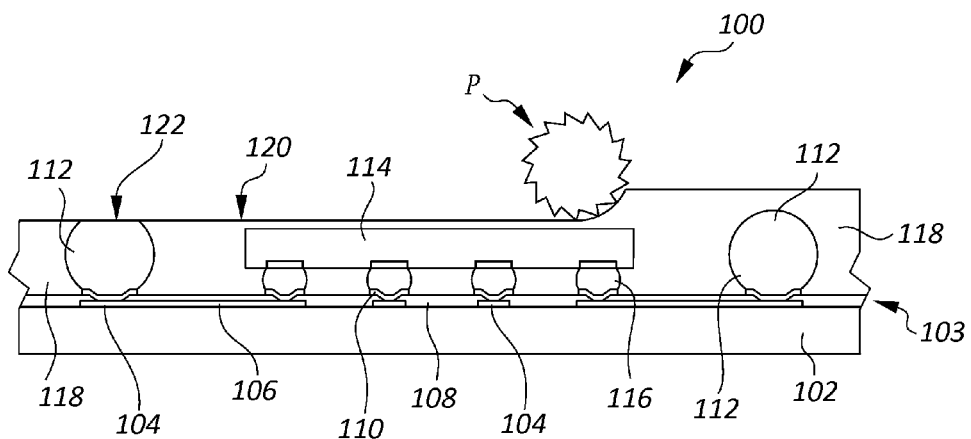

Following the reflow step, as shown in FIG. 3, a molding compound layer 118 is formed over the substrate 102, encapsulating the semiconductor die 114 and the solder balls 112. After the molding compound layer 118 is cured, it is planarized, as indicated at P in FIG. 3, to reduce its thickness. The planarizing process leaves a surface 120 on the molding compound layer 118 and removes a small portion of each of the solder balls 112, resulting in pads 122 being formed at the surface 120 of the molding compound layer 118. The molding compound layer 118 can be planarized by any appropriate process, such as mechanical polishing, chemical etch, CMP, grinding, or any acceptable process.

Figure 4:
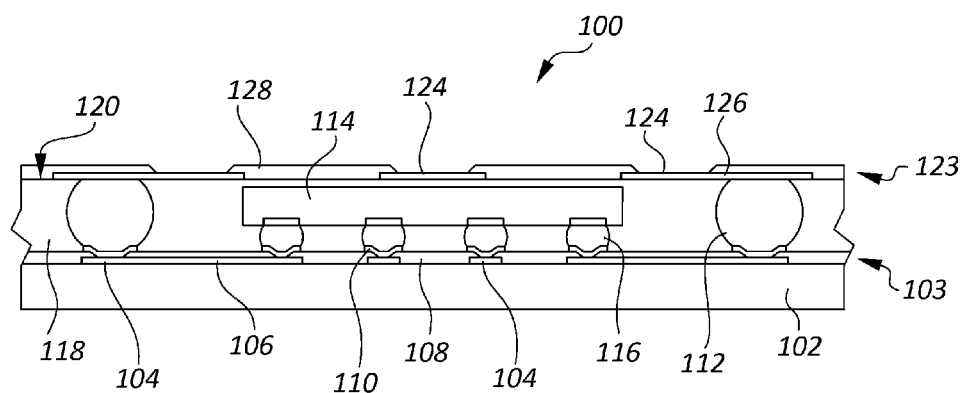

As shown in FIG. 4, a second RDL 123 is formed on the surface 120 of the molding compound layer 118, and includes, in the embodiment shown, contact pads 124, electrical traces 126, and a dielectric layer 128. The electrical traces 126 are positioned to make contact with the pads 122 so as to place the solder balls 112 in electrical contact with respective contact pads 124.

Figure 5:
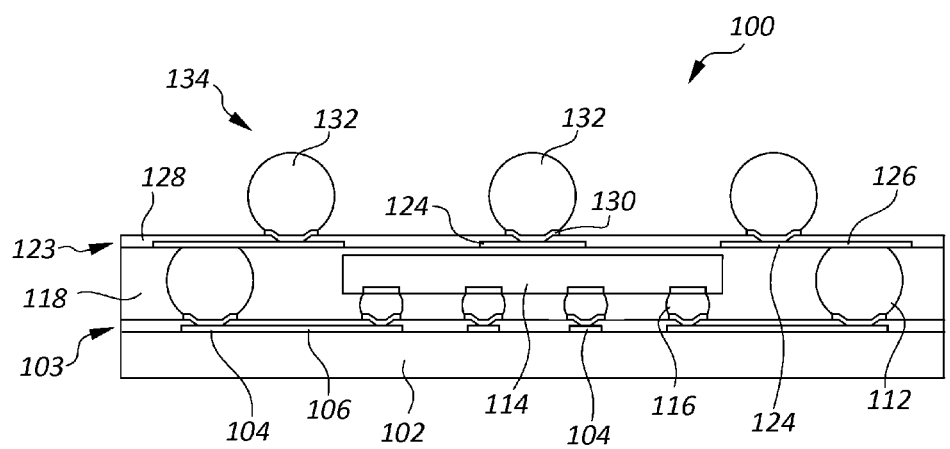
FIG. 5 is a diagrammatical side view of the finished package of the embodiment of FIGS. 1-4.

Turning to FIG. 5, a UBM layer 130 is then deposited and patterned over the contact pads 124, and solder balls 132 are positioned on the pads. The solder balls 132 are reflowed to adhere them to the contact pads 130, forming a ball grid array 134. The wafer is then singulated to form individual packages 100. Thus, in FIG. 5 the package 100 is shown with cut edges, indicating that it has been separated from the original wafer.

The package 100 provides a number of advantages over conventional eWLB packages. For example, where the substrate 102 and the semiconductor die 114 are made from the same material, such as silicon, they will both have the same coefficient of thermal expansion, which eliminates problems associated with different rates of expansion between semiconductor dies and substrates or circuit boards. The solder balls 132 that will be coupled to a circuit board are not directly coupled to contact pads of the semiconductor dies, so the die is not subjected to the stresses associated with the temperature differentials. Additionally, the silicon substrate 102 is more thermally conductive than most molding compounds, so it is able to draw heat from the silicon die more efficiently (via the micro-bumps 116), and to transmit the heat to its opposite face to be disposed of by various known means. Configured as shown in the embodiment of FIGS. 1-5, the substrate 102 is on the side of the package opposite the BGA 134, and so can act as a heat sink to draw heat from the die 114 for dissipation by active or passive cooling. Heat is also transmitted to the underlying circuit board via the BGA 134, which is adjacent the back side of the die 114.

Another advantage is related to the solder balls 112 by which the first RDL 103 is coupled to the second RDL 123. Through holes formed in a molding compound wafer tend to have rough surfaces that do not readily accept plating for formation of through vias. Where structures provide through vias that are formed in a molding compound layer by methods corresponding to known processes of forming through-silicon vias (TSV), the manufacture of such vias is difficult and often unsuccessful. In contrast, the solder balls 112 are not subject to such problems, but provide very reliable through connections.

Figure 6:
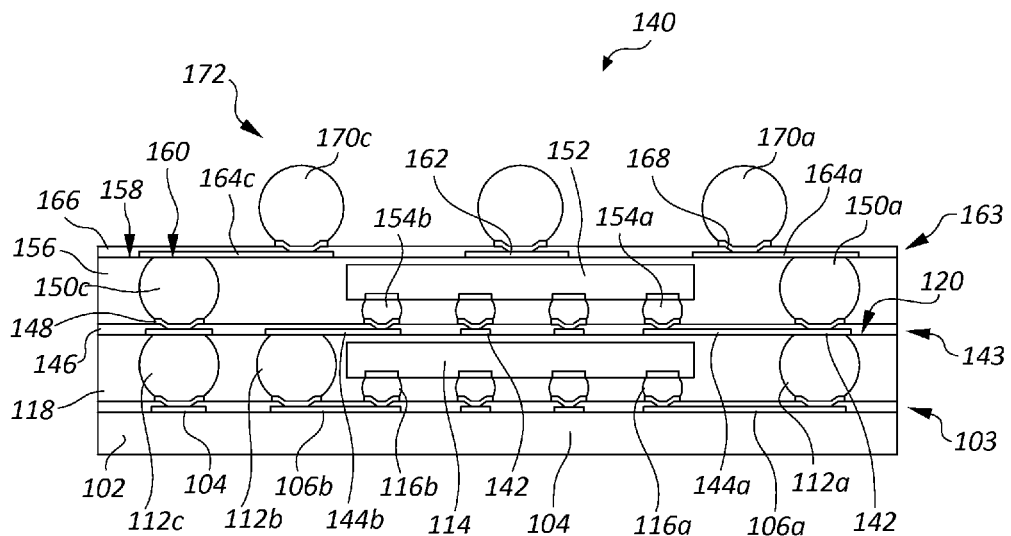
FIG. 6 is a diagrammatical side view a semiconductor package according to another embodiment.

Turning now to FIG. 6, a completed 3D package 140 is shown, according to another embodiment, in which multiple dies are stacked. The method for manufacturing the package 140 is substantially identical to that of the package 100 through the steps described with reference to FIG. 3. Following the planarization process, a second RDL 143 is deposited on the surface 120 of the molding compound layer 118. The second RDL 143 is, in many respects similar to the second RDL 123 described with reference to FIGS. 4 and 5, and includes a plurality of contact pads 142, electrical traces 144, and a dielectric layer 146. In addition to contact pads 142 configured to receive solder balls 150, however, the plurality of contact pads 142 of the package 140 includes landing pads configured to receive micro-bumps 154 of a second semiconductor die 152. Following placement of the solder balls 150 and the second die 152, and reflow of the solder balls and micro-bumps 154, a second molding compound layer 156 is deposited and cured substantially as described with reference to the molding compound layer 118. A second planarizing step is then performed, forming planarized surface 158 and creating pads 160 of the solder balls 150, substantially as described with reference to FIG. 3.

A third RDL 163 is then formed, substantially as described with reference to the second RDL 123 of FIGS. 4 and 5. The third RDL 163 includes contact pads 162, electrical traces 164 that electrically couple the contact pads to the pads 160 of the solder balls 150, a dielectric layer 166, and UBM layer 168. solder balls 170 are placed and reflowed to form ball grid array 172. At the conclusion of all these steps, the individual packages are singulated to provide the final single package of FIG. 6.

While no attempt is made to show all of the possible configurations of connections that can be made in and between the various levels of the packages of the embodiments disclosed, a few are shown by way of example. With reference to the package 140 of FIG. 6, electrical trace 106a is shown coupled between micro-bump 116a and solder ball 112a. In the next layer, trace 144a is deposited over and in contact with solder ball 112a, and is coupled between micro-bump 154a and solder ball 150a. Meanwhile, in the RDL 163, electrical trace 164a is deposited over and in contact with solder ball 150a, and is coupled to solder ball 170a. Thus, it can be seen that the micro-bumps 116a and 154a are coupled to each other as well as to solder ball 170a, by which they will be electrically coupled directly to a trace or component on a circuit board when the package 140 is mounted. A similar arrangement is shown with reference to micro-bumps 116b and 154b, which are electrically coupled to each other via electrical trace 106b, solder ball 112b, and electrical trace 144b. However, there is no solder ball 150 shown in electrical contact with the electrical trace 144b, so the micro-bumps 116b and 154b are isolated from any direct connection to the circuit board via solder balls 170 on the third RDL 163. The circuit pads on die 114 and die 152 are therefore directly coupled to each other without any part of the electrical path being outside the package.

As a further example, solder balls 112c and 150c are shown stacked above and in electrical contact with each other, and with solder ball 170c via electrical trace 164c, but no electrical contact is shown between either of the solder balls 112c or 150c and any other element, apart from the solder ball 170c. Of course such contact can be provided by electrical traces located outside the visible plane of FIG. 6, to connect one or both solder balls to respective micro-bumps. Additionally, such stacked connections can be used to route signal paths around obstacles in a given RDL. For example, in some circuit designs, a connection between two points on a same layer can be impossible to make via an electrical trace because of a particular circuit pattern that completely blocks any passage. In such a case, it is generally necessary to deposit another conductive layer over the dielectric layer of the RDL and define additional traces that bridge the obstruction. However, with this invention, by routing the signal path from one layer to another, then back to the one layer at another location, it may be possible to avoid the expense of depositing and defining additional conductive and dielectric layers.

On the basis of the principles disclosed herein, embodiments that include three or more semiconductor dies stacked in a single 3D package can be produced, and reliable interconnections provided.

Figure 7:
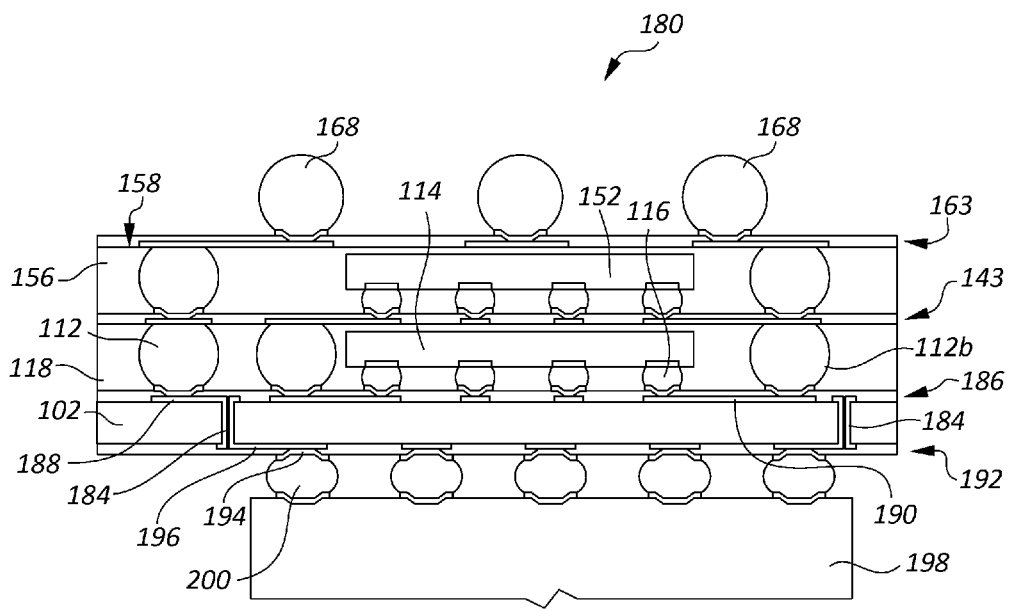
FIG. 7 is a diagrammatical side view a semiconductor package according to a further embodiment.

FIG. 7 is a side diagrammatical representation of a semiconductor device package 180 according to another embodiment. In many respects, the device 180 of FIG. 7 is substantially identical to the device 140 of FIG. 6, and the method of manufacture likewise includes elements that correspond to those previously described with reference to the embodiments of FIGS. 1-6. In the device 180 the substrate 102 is configured to serve as an interposer, providing interface connections for placement of an additional package 198.

Prior to performing the process that corresponds to formation of the first RDL 103, described with reference to FIG. 1, TSVs 184 are formed in the silicon substrate 102 in accordance with well known processes, which include drilling and plating apertures in the silicon wafer 102. Following formation of the TSVs 184, a first RDL 186 is formed substantially as described with reference to FIG. 1, except that, in addition to coupling micro-bumps 116 to respective solder bumps 112, electrical traces 196 also connect the micro-bumps and/or solder bumps to the TSVs, according to selected patterns and arrangements. An additional RDL 192 is formed on the opposite face of the silicon substrate 102, including deposition and patterning of a conductive layer to form contact pads 194 and electrical traces 196. The traces 196 place the contact pads in electrical contact with respective ones of the TSVs 184. A UBM layer is formed and defined over the contact pads 194, which will act as landing pads for solder bumps 200 of the semiconductor package 198.

Formation of additional elements of the package 180, including molding compound layers 118, 156, and second and third RDLs 143, 163, etc., is performed substantially as described above with reference to previous embodiments, and so will not be described in detail.

According to an alternative embodiment, a package is produced that is similar to the package 180 of FIG. 7, except that contact pads 194 are positioned to receive a ball-grid-array on the RDL 192 for connection to a circuit board. RDL 163 can be configured to receive a separate package, in a package-on-package configuration, or, according to other embodiments, can be entirely omitted.

The devices of the disclosed embodiments include a number of solder connectors that are subject to reflow processes. In one embodiment, each solder connection is reflowed at a separate time. For example, referring to the embodiment of FIG. 6, a first reflow step is performed to reflow solder balls 112 and micro-bumps 116. A second reflow is performed to reflow solder balls 150 and micro-bumps 154. A third reflow is performed to reflow solder balls 170, and, finally, the solder balls 170 are subjected to another reflow when the package 140 is eventually coupled to a circuit board. According to one embodiment, the alloy selected for each successive layer of solder balls/micro-bumps is selected to melt at a lower temperature than the alloy of the preceding layer. During reflow, the package is heated to a temperature sufficient to melt and reflow the solder of that layer, but not the solder of preceding layers. According to another embodiment, during the reflow process, heat is applied locally, so that only the portions of the package in contact with the solder elements to be reflowed are heated to the reflow temperature. Other portions remain below the reflow temperature, and other solder elements are not remelted, even though the same solder alloy is used for all layers. Alternatively, the material of the molding compound layer 118 is selected to act as a thermal barrier to keep the first balls 116 from reflowing while the second balls 132 are reflowed. Heat is applied for a time period sufficiently short to keep the embedded balls 116 below their reflow temperature. Alternatively, the entire package can be reflowed at one time, in a single step by taking it to a high temperature and holding it there for a longer time period.

The embodiments of the present disclosure, in which the redistribution layers are shown with a single conductive layer and a single dielectric layer, are merely exemplary. Formation of redistribution layers is well known in the art, and can include multiple conductive layers, dielectric layers, passivation layers, etc. Furthermore selection of the location of the various elements, including contact pads and electrical traces, is a design choice that is made according to the intended interconnections of a particular device.

The term redistribution layer is sometimes used in the art to refer to a single conductive layer, while at other times it is used so broadly as to refer to any related structure, including support substrates, laminate strips and bases, etc. For the purposes of the present disclosure and claims, redistribution layer is a structure that includes one or more layers of dielectrics and conductors that are formed or deposited on an underlying substrate or layer to create and isolate redistributing signal paths of a semiconductor die, including a die of a reconfigured wafer.

Terms such as circuit pads, contact pads, landing pads, etc., are used substantially synonymously to refer to different structures that are functionally, and often structurally similar. Accordingly, where the claims use such terms, the language is for clarity purposes to identify one element from another and not because they necessarily have different structures, and the corresponding elements are not limited by the terms as used in the description.

Formation of elements such as contact pads, conductive traces, dielectric layers, UBM layers, etc., can be accomplished using many different processes that are very well known in the art. For example, according to one process, a thin metallic seed layer is deposited on a substrate, a positive-acting photosensitive plating resist layer is deposited over the seed layer, a photo mask is positioned over the resist layer, and the resist layer is exposed through the mask to a light source for a prescribed period, so that some portions of the resist layer are prevented from being exposed by the image of the mask. The resist layer is processed to remove the exposed portions of the layer, which in turn exposes the surface of the seed layer at those locations. The substrate is subjected to a plating process, during which a thick layer of metal is plated onto the seed layer in the locations where it is not covered by the resist layer. The resist layer is then removed leaving the plated metal layer in the form of the image. Finally, a chemical etch is performed, during which portions of the metal are dissolved. The timing of the etch process is sufficient to remove the entire thickness of the seed layer, where it was covered during plating step by the resist, but that removes only a small portion of the thick plated metal material. This process is one of many different processes by which a feature or layer can be formed, and in many cases, the selection of one process over another is merely a design choice, where any of several processes would be satisfactory. In other cases, selection of the process is influenced by factors such as, e.g., materials involved, cost, scale, etc. Because such processes are well known and understood, they will not be described in detail where the choice of process is not material to the disclosure.

All of the embodiments depicted in the drawings are shown with a consistent orientation, to reduce the possibility of confusion in describing the various elements and the associated manufacturing processes. The orientation shown is not intended to indicate the orientation at which particular processes are performed, or at which the finished packages are mounted to circuit boards or chip carriers.

Devices that are formed on semiconductor material substrates are typically formed on only one surface thereof, and actually occupy a very small part of the total thickness of the substrate. This surface is generally referred to by various terms such as the active, front, or top surface. Likewise, for the purposes of the present disclosure and claims, the terms front and back are used to establish an orientation with reference to a semiconductor wafer or die. For example, where a device includes a semiconductor die, reference to a front surface of some element of the device can be understood as referring to the surface of that element that contains the active surface of the die. Of course, a back surface of a die is the surface that would be opposite, given the same orientation of the device. Use of these terms to refer to an element of such a device is not to be construed as indicating an actual physical orientation of the element, the device, or the associated semiconductor component, and, where used in a claim, does not limit the claim except as explained above.

The term over is used in the specification and claims to refer to the relative positions of two or more elements with respect to a third element, although the third element may be implied by the context. The term on is used to refer to a physical relationship between two elements. Neither term should be construed as requiring direct physical contact between the elements, nor should they be construed as indicating any particular orientation, either absolute, or with respect to the third element. So, for example, if a claim recites a second layer positioned on a substrate over a first layer, this phrase indicates that the second layer is coupled to the substrate and that the first layer is between the second layer and the substrate. It does not indicate that the layers are necessarily in direct physical contact with each other or with the substrate, but may instead have one or more intervening layers or structures. It also does not indicate that the substrate is oriented in a manner that places the second layer physically above the first layer, nor that, for example, the layers are positioned over a front face of the substrate, as that term is used herein.

Ordinal numbers are used in the specification and claims to distinguish between elements so referenced. There is no necessary significance to the value of a number assigned to one element relative to other numbered elements. Furthermore, an ordinal number used to refer to an element in the claims does not necessarily correlate to a number used to refer to an element in the specification on which the claim reads. Nor does an ordinal number used to refer to a given element in one claim necessarily correlate with a number used to refer to a similar or corresponding element in an unrelated claim—obviously, where a claim refers to a numbered element of a claim from which it depends, the numbers will correspond.

The term couple, as used in the claims, includes within its scope indirect coupling, such as when two elements are coupled with one or more intervening elements, even where no intervening elements are recited.

Molding compounds are substances used to encapsulate semiconductor devices in many different packaging processes, are typically composite materials made from blends of ingredients such as, e.g., resins, hardeners, silicas, catalysts, pigments, and release agents, and are generally provided in a substantially liquid form of a selected viscosity so that they can be injected or poured. Molding compounds are available in a very wide range of formulations from different manufacturers and to meet many different criteria. Accordingly, the term molding compound is to be construed broadly to apply to all such compounds.

In the drawings, where letters are combined with reference numbers, e.g., 112a, the letters are not intended to indicate an element that is functionally or structurally distinct from other elements that are indicated by the same number, but are provided where the description points to one or more specific ones of a plurality of like elements.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a support substrate having a front face and a back face;
    a first redistribution layer positioned on the front face of the support substrate, and having a first plurality of contact pads and a first plurality of electrical traces extending between respective pairs of the first plurality of contact pads;
    a first molding compound layer positioned on the front face of the support substrate over the first redistribution layer;
    a first semiconductor die having a plurality of circuit pads positioned on a front face of the first die, the first semiconductor die being substantially embedded in the first molding compound layer, the first die being positioned with the front face facing the first redistribution layer, and having the circuit pads electrically coupled to a respective one of the first plurality of contact pads;
    a first plurality of solder balls substantially embedded in the first molding compound layer and positioned on the first redistribution layer on a respective one of the first plurality of contact pads, a portion of each of the first plurality of solder balls lying coplanar with a face of the first molding compound layer;
    a second redistribution layer positioned on the face of the first molding compound layer, the second redistribution layer including a second plurality of contact pads and a second plurality of electrical traces extending between respective pairs of the second plurality of contact pads, each of the first plurality of solder balls being electrically coupled to a respective one of the second plurality of electrical traces; and
    a plurality of through vias located in the support substrate, each of the through vias extending from the front face of the support substrate to the back of the support substrate, each of the through vias being in electrical contact with a respective one of the first plurality of electrical traces.

2. The device of claim 1, comprising a plurality of solder joints that electrically couple each of the circuit pads of the first semiconductor die to the respective one of the first plurality of contact pads of the first redistribution layer.

3. The device of claim 1, comprising a second plurality of solder balls, each positioned over and electrically coupled to one of the second plurality of contact pads.

4. The device of claim 3 wherein the second plurality of solder balls is arranged in a ball grid array configured to electrically couple the device to a circuit board.

5. The device of claim 4, comprising:
a second molding compound layer positioned on the face of the first molding compound layer; and
a second semiconductor die having a plurality of circuit pads positioned on a front face thereof, the second semiconductor die being substantially embedded in the second molding compound layer, each of the circuit pads of the second semiconductor die electrically coupled to a respective one of the second plurality of contact pads, each of the second plurality of solder balls being substantially embedded in the second molding compound layer with a back portion of each of the second plurality of solder balls lying coplanar with a face of the second molding compound layer.

6. The device of claim 1 wherein the support substrate is silicon.

7. A device comprising:
a support substrate having a front and a back face;
first redistribution layer positioned on the front face of the support substrate, and having a first plurality of contact pads and a first plurality of electrical traces extending between respective pairs of the first plurality of contact pads, wherein the first redistribution layer positioned includes a second plurality of contact pads and a second plurality of electrical traces;
a first molding compound layer positioned on the front face of the support substrate over the first redistribution layer;
a first semiconductor die having a plurality of circuit pads positioned on a front face of the first die, the first die being positioned with front face facing the first redistribution layer, and having the circuit pads electrically coupled to a respective one of the first plurality of contact pads;
a first plurality of solder balls substantially embedded in the first molding compound layer and positioned on the first redistribution layer on a respective one of the first plurality of contact pads, a portion of each of the first plurality of solder balls lying coplanar with a face of the first molding compound layer;
a second redistribution ;layer positioned on the face of the first molding compound layer, the second redistribution layer including a second plurality of contact pads and a second plurality of electrical traces extending between respective pairs of the second plurality of contact pads, each of the first plurality of solder balls being electrically coupled to a respective one of the second plurality of electrical traces;
a plurality of through vias located in the support substrate, each of the through vias extending from the front face of the support substrate to the back of the support substrate, each of through vias being in electrical contact with a respective one of the first plurality of electrical tracers, each of the plurality of through vias electrically coupling one of the second plurality of electrical traces electrically coupling one of the second plurality of contact pads to a respective one of the plurality of through vias.

8. The device of claim 7, comprising a second plurality of solder balls, each of the solder balls positioned over and electrically coupled to one of the second plurality of contact pads.

9. The device of claim 8 wherein the second plurality of solder balls is arranged in a ball grid array configured to electrically couple the device to a circuit board.

10. The device of claim 7 wherein the support substrate is silicon.

* * * * *

UNITED STATES PATENT AND TRADEMARK OFFICE
CERTIFICATE OF CORRECTION

PATENT NO. : 8,779,601 B2
APPLICATION NO. : 13/287826
DATED : July 15, 2014
INVENTOR(S) : Kah Wee Gan et al.

It is certified that error appears in the above-identified patent and that said Letters Patent is hereby corrected as shown below:

In the claims,

Column 8, Line 67:
"the support substrate to the back of the support substrate," should read, --the support substrate to the back face of the support substrate,--.

Column 9, Line 30:
"a support substrate having a front and a back face;" should read, --a support substrate having a front face and a back face;--.

Column 10, Line 2:
"positioned on a front face of the first die, the first die" is incorrect, should read, --positioned on a front face of the first die, the first semiconductor die being substantially embedded in the first molding compound layer, the first die--.

Column 10, Line 13:
"a second redistribution ;layer positioned on the face of the" should read, --a second redistribution layer positioned on the face of the--.

Signed and Sealed this
Sixth Day of October, 2015

Michelle K. Lee
*Director of the United States Patent and Trademark Office*